(12) United States Patent
Ohkawa

(10) Patent No.: US 6,169,692 B1
(45) Date of Patent: Jan. 2, 2001

(54) NON-VOLATILE SEMICONDUCTOR MEMORY

(75) Inventor: Masayoshi Ohkawa, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/086,412

(22) Filed: May 29, 1998

(30) Foreign Application Priority Data

May 29, 1997 (JP) .................................................. 9-140386

(51) Int. Cl.$^7$ .................................................. G11C 16/00
(52) U.S. Cl. .................................. 365/185.29; 365/185.27
(58) Field of Search ......................... 365/185.27, 185.18, 365/185.29

(56) References Cited

U.S. PATENT DOCUMENTS

| | | | |
|---|---|---|---|
| 4,884,239 | * 11/1989 | Ono | 365/185.27 |
| 5,349,220 | * 9/1994 | Hong | 365/185.27 |
| 5,742,541 | * 4/1998 | Tanigami | 365/185.27 |
| 5,793,678 | * 8/1998 | Kato | 365/185.27 |
| 5,991,205 | * 11/1999 | Hara | 365/185.29 |

FOREIGN PATENT DOCUMENTS

| | | |
|---|---|---|
| 4-229655 | 8/1992 | (JP) . |
| 5-343700 | 12/1993 | (JP) . |

OTHER PUBLICATIONS

Toshikatsu Jinbo et al, "A 5–V–Only 16–Mb Flash Memory with Sector Erase Mode", *IEEE Journal of Solid–State Circuits*, vol. 27, No. 11, Nov. 1992, pp. 1547–1554.

* cited by examiner

Primary Examiner—A. Zarabian
(74) Attorney, Agent, or Firm—Sughrue, Mion, Zinn, Macpeak & Seas, PLLC

(57) ABSTRACT

A memory cell having a floating gate is formed on a semiconductor substrate of a first conduction type and is disposed in a region having a deep well of a second conduction type formed to a semiconductor substrate and a shallow well of a first conduction type formed in the deep well. An erasing operation of emitting electrons from floating gates is conducted utilizing a tunneling phenomenon by setting a control gate terminal to ground voltage and a source terminal S to $V_{PP}$. The deep and shallow wells are supplied with $V_{CC}$ at time t1 and a source terminal is supplied with $V_{PP}$ at time t2 after a predetermined period of time from time t1 has elapsed.

12 Claims, 3 Drawing Sheets

NON-VOLATILE SEMICONDUCTOR MEMORY

BACKGROUND OF THE INVENTION

1. Field of the Invention

The present invention relates to a non-volatile semiconductor memory and, more particularly, it relates to a method of erasing a MOS flash memory.

2. The Related Art

FIG. 2 is a cross sectional view of a flash memory cell having a floating gate structure according to the prior art. The flash memory cell comprises a semiconductor substrate 31, a drain 34, a source 35, a control gate 36 and a floating gate 37. Terminals D, S, G and B are voltage terminals for applying voltage to the drain 34, the source 35, the control gate 36 and the semiconductor substrate 31, respectively.

The flash memory of a channel hot electron type having the structure as shown in FIG. 2 conducts writing by injecting electrons into the floating gate 37 by utilizing a hot electron phenomenon and conducts erasing by withdrawing electrons in the floating gate 37.

In the flash memory of the structure shown in FIG. 2, a first erasing method comprises generating a tunnel current by setting each of the terminals B and G to the ground potential (hereinafter referred to as GND), and setting the terminal S to a first positive potential (hereinafter referred to as $V_{PP}$) and keeping the terminal D open (open state), thereby emitting electrons from the floating gate 37 to the source 35. Further, a second erasing method comprises generating a tunnel current by setting the terminal G to a negative potential (hereinafter referred to as $V_{ER}$), the terminal S to a second positive potential (hereinafter referred to as $V_{CC}$), setting the terminal B to GND and keeping the terminal D open, thereby emitting electrons from the floating gate 37 to the source 35. It is assumed that: $GND<V_{cc}<V_{PP}$ However, in the first erasing method in FIG. 2, since a potential difference is great between the potential for the source 35 ($V_{PP}$) and the potential for the semiconductor substrate 31 (GND), there is a problem that charge is produced by hot electron phenomenon between the source 35 and the semiconductor substrate 31 so that the charge is introduced into an oxide film formed on the semiconductor substrate 31 by inter-band tunneling.

Further, in the second erasing method in FIG. 2, while a potential difference between the source 35 and the semiconductor substrate 31 can be decreased, this involves a problem of additionally requiring a circuit for generating a negative voltage $V_{ER}$.

For overcoming the above-described prior art problem, techniques as described in Japanese Patent Laid-Open No. Hei 4-229655 (hereinafter referred to as "Publication 1") and Japanese Patent Laid-Open No. Hei 5-343700 (hereinafter referred to as "Publication 2") have been developed.

FIG. 3 is a cross sectional view of a flash memory cell described in Publication 1. A flash memory cell shown in FIG. 3 comprises a semiconductor substrate 41, a deep well 42 of a conduction type opposite to that of the semiconductor substrate 41, a shallow well 43 of a conduction type identical with that of the semiconductor substrate 41, a drain 44, a source 45, a control gate 46 and a floating gate 47. Further, terminals D, S, G and BB are voltage terminals for applying voltage to the drain 44, the source 45, the control gate 46 and the semiconductor substrate 41 respectively. Terminals DW and W are voltage terminals for applying voltage to the deep well 42 and the shallow well 43 respectively, in which the terminal W corresponds to the terminal B in FIG. 2.

A first erasing method in the flash memory cell of the structure shown in FIG. 3 comprises withdrawing electrons from the floating gate 47 into the semiconductor substrate 41 while keeping the terminals D and S open, and setting the terminals G and BB to GND and applying $V_{PP}$ to the terminals W and DW. This prevents inter-band tunneling between the source 45 and the semiconductor substrate 41. Further, a second erasing method applies $V_{ER}$ to the control gate 46 (terminal G) while setting the potential for the semiconductor substrate 41 (terminal BB) to $V_{CC}$ as described in Journal of Solid State Circuits, Vol. 127, No. 11, November 1992: pp 1547–1553.

However, in the first erasing method of Publication 1, in a case of applying $V_{PP}$ to the deep well 42 and the shallow well 43, there is a problem of a withstand voltage between the semiconductor substrate 41 and the wells 42, 43. The second erasing method for the second prior art involves a problem of additionally requiring a circuit for generating a negative voltage $V_{ER}$ like that the second erasing method in the preceding prior art.

The erasing method of prior art Publication 2 keeps the terminals G, BB to GND by setting the terminals D and DW open, and sets the terminal W to $V_{CC}$, the terminal S to $V_{PP}$ and the terminals G and BB to GND of the FIG. 3. The Publication 2 prior art decreases the potential difference between the source 45 and the semiconductor substrate 41 by setting the terminal W to $V_{CC}$, thereby preventing the inter-band tunneling. The erasing method shown in Publication 2 has a merit, for example, of not requiring a circuit for generating the negative potential $V_{ER}$.

However, the inventor discovered that the erasing method of Publication 2 causes problems to be described below under the following structure.

A MOS transistor formed on a silicon substrate is a 4-terminal device in which a voltage is applied also to a substrate. A contact for applying the voltage to the substrate is formed near the transistor. However, actually, since the memory is disposed while densely arranging memory cells in order to efficiently use a chip, the contact is disposed to the outer circumference of a memory cell array. The situation is identical also in the memory of a triple well structure. Such a structure is shown in FIG. 4A.

FIGS. 4A and 4B show a flash memory of a triple well structure in the related art. FIG. 4A is a cross sectional view of the flash memory and FIG. 4B shows a voltage wave form supplied with each of portions of the flash memory. The flash memory cell of a triple well structure shown in FIG. 4A comprises a semiconductor substrate 21, a deep well 22 of a conduction type opposite to that of the semiconductor substrate 21, a shallow well 23 of a conduction type identical with that of the semiconductor substrate 21, drains 241, 242, sources 251, 252, control gates 261, 262 and floating gates 271, 272. Further, terminals D, S, G and BB are voltage terminals for applying voltage to the drains 241 and 242, the sources 251 and 252, the control gates 261 and 262 and the semiconductor substrate 21, respectively. The terminals DW and W are terminals for applying voltage to the deep well 22 and to the shallow well 23 respectively, the terminal W corresponds to the terminal B in FIG. 2. Resistor r represents a resistive component of the well 23 and capacitor c represents a parasitic capacitance component between the semiconductor substrate 21 and the well 23.

Now, a first memory cell comprising the drain 241, the source 251, the control gate 261 and the floating gate 271 is formed at the end of a well (memory cell array). A second memory cell comprising the drain 242, the source 252, the control gate 262 and the floating gate 272 is formed at a central portion of the well (memory cell array).

A structure comprising the semiconductor substrate 21, the deep well 22 and the shallow well 23 shown in the related art has a high resistance since the doping amount of impurities is small. Accordingly, as shown in FIG. 4A, a delay for the change of the potential is caused in a portion Y of the semiconductor substrate of the second memory cell at the central portion of the memory cell array due to the resistor r and the parasitic capacitance c, compared with that in a portion X of with the semiconductor substrate of the first memory cell at the end of the memory cell array when the voltage is applied to the wells 22 and 23. As shown in FIG. 4B when erasing voltages $V_{PP}$ and $V_{CC}$ are applied simultaneously to the sources 251, 252 (terminal S) and the wells 22, 23 (terminal W, DW), the substrate potential in Y increases with a delay compared with the substrate potential in X. Since the voltage difference is therefore great between the source 252 and the shallow well 23 at the portion Y to possibly cause inter-band tunneling. Further, this may possibly increase scattering of erasing.

SUMMARY OF THE INVENTION

It is therefore an object of the present invention to provide a method for suppressing the inter-band tunneling upon erasing of flash memory having the triple well structure.

An erasing method for a semiconductor memory having a substrate, a floating gate, a control gate and a source formed over said substrate of the present invention comprises the steps of: applying a first voltage to the substrate; and applying a second voltage higher than the first voltage to the source after the first voltage is applied to the substrate.

A semiconductor memory having a floating gate of the present invention comprises: a substrate; a source formed on the substrate; a first voltage applying circuit which applied a first voltage to the substrate; and a second voltage applying circuit which applies a second voltage higher than the first voltage to the source; wherein the second voltage is applied to the source after the first voltage is applied to the substrate.

A semiconductor memory device of the present invention comprises: a semiconductor substrate of a first conductive type; a first well formed on the semiconductor substrate, the first well being a second conductive type; a second well formed on the first well, the second well being the first conductive type; and a first memory cell having a first control gate and a first diffusion region; wherein the diffusion region is supplied with a first voltage after the second well is supplied with a second voltage lower than the first voltage.

As described above, in the semiconductor memory according to the present invention, since the memory cell is erased after eliminating a local potential difference in the semiconductor substrate of the memory cell array, it is possible to suppress scattering of erasing caused, for example, by local inter-band tunneling.

BRIEF DESCRIPTION OF THE DRAWINGS

The above and other objects, advantages and features of the present invention will be apparent from the following description taken in conjunction with the accompanying drawing, in which.

DETAILED DESCRIPTION OF THE PREFERRED EMBODIMENTS

Figure 1A:
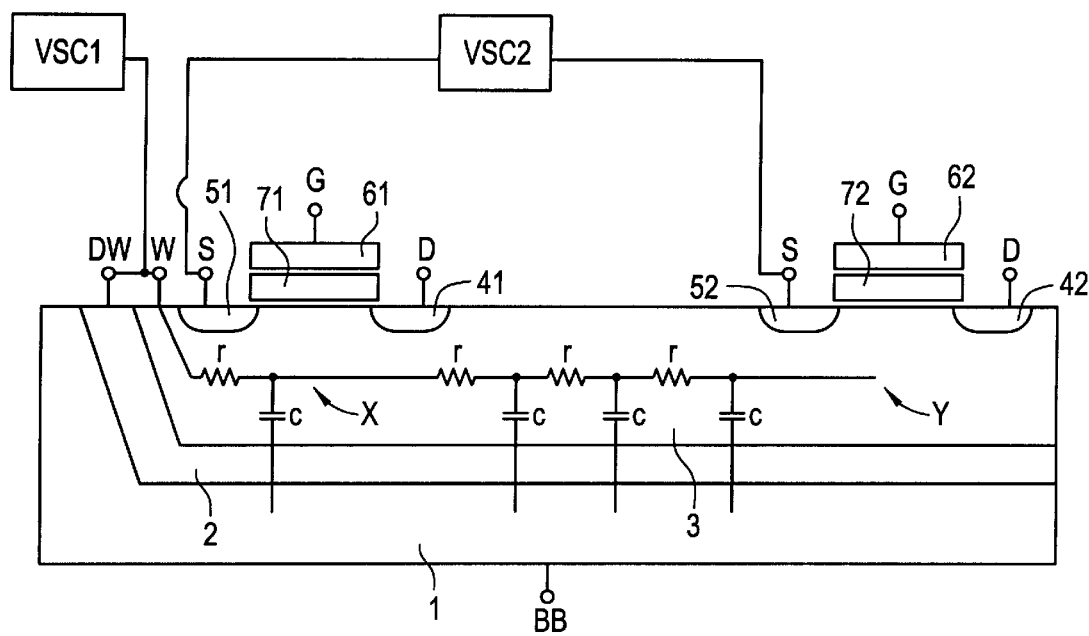
FIG. 1A is a cross sectional view of a flash memory of a first embodiment of the present invention and FIG. 1B shows the respective voltages supplied with each of portions of the flash memory shown in FIG. 1A.
Figure 1B:
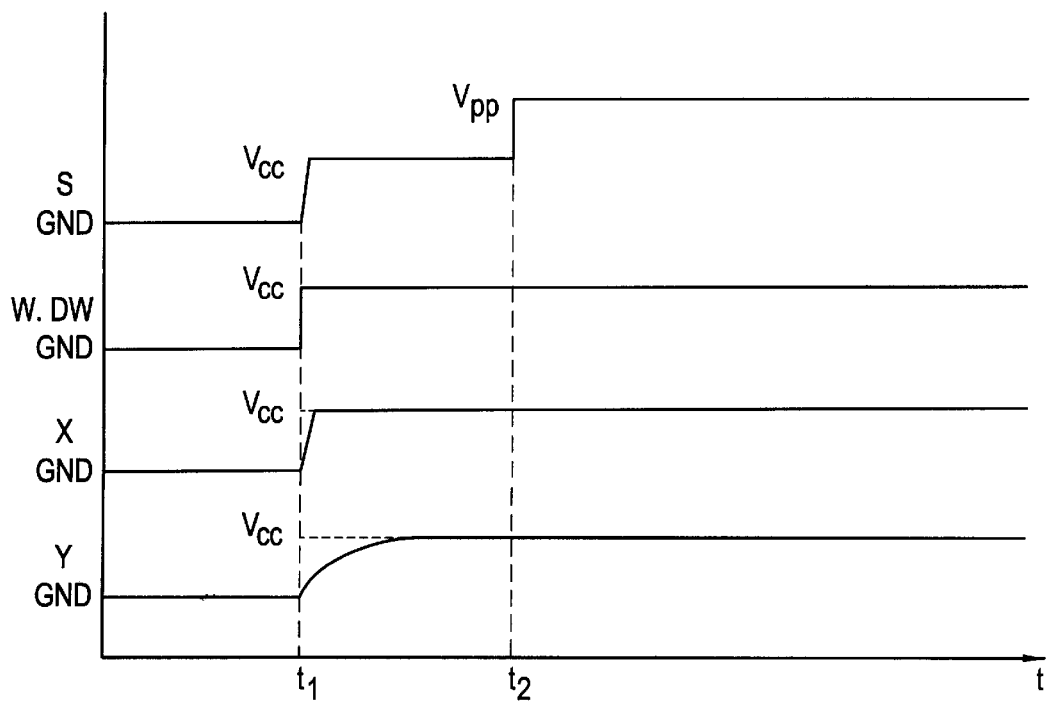

A first embodiment of the present invention is explained by FIGS. 1A and 1B.

The flash memory of the triple well structure shown in FIG. 1A comprises a semiconductor substrate 1 having for example, P conductive type, a deep well 2 of a conductive type, for example, N type, opposite to that of the semiconductor substrate 1, a shallow well 3 of a conductive type, for example, P type, identical with that of the semiconductor substrate 1, drains 41, 42 having for example N type, sources 51, 52 of for example N type, control gates 61, 62, and floating gates 71, 72. Further, terminals D, S, G and BB are voltage terminals for applying voltage to the drains 41 and 42, the sources 51 and 52, the control gates 61 and 62 and the semiconductor substrate 1, respectively. The terminals S are connected to a voltage supply circuit VSC2 to supply voltages $V_{CC}$ and $V_{PP}$ to the source 51. The terminals DW and W are voltage terminals for applying voltage to the deep well 2 and the shallow well 3 respectively, in which the terminal W corresponds to the terminal B in FIG. 2. The terminals DW and W are connected to a voltage supply circuit VSC1 to supply voltage $V_{CC}$ to the wells 2 and 3. In FIG. 1A, the wells 2 and 3 surrounding the memory cell are disposed on every erasing unit.

Figure 2:
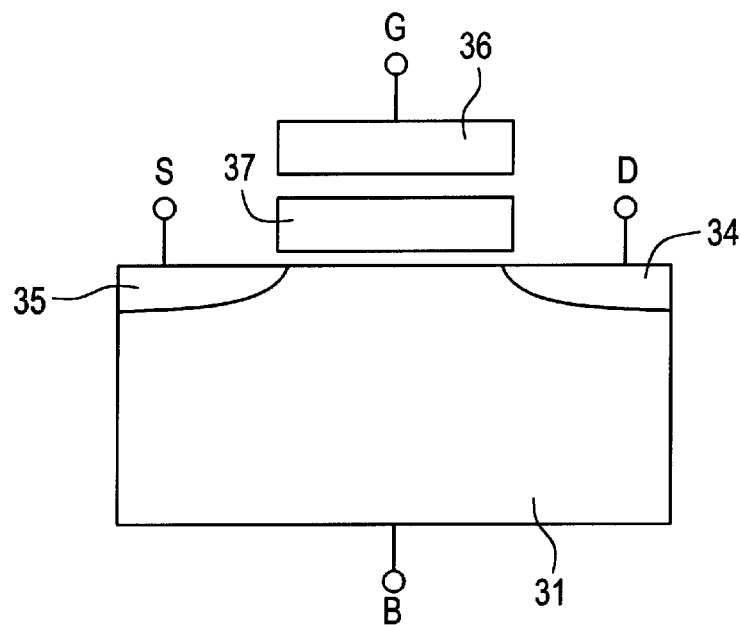
FIG. 2 is a cross sectional view of a conventional flash memory cell.
Figure 3:
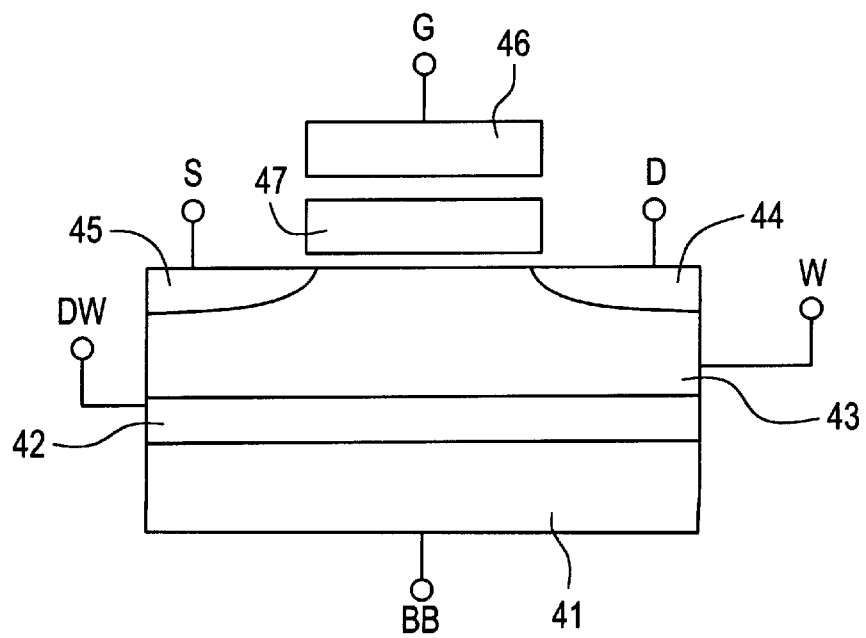
FIG. 3 is a cross sectional view of a conventional flash memory cell.

It is at first described to apply a method of the present invention to the memory cell shown in FIG. 2 to explain concept of the present invention. In this case, the $V_{CC}$ which is the first erasing voltage, for example 3.3V is applied to a back gate terminal B for the substrate 31 as the first erasing operation at time t1. At that time, the Drain 34 is open and a gate terminal G is supplied with GND. Then, after lapse of a predetermined period of time, $V_{PP}$ which is the second erasing voltage, for example 15V, is applied to the source terminal S for the source 35 at time t2.

According to another embodiment of the semiconductor memory, a triple well structure as shown in FIG. 1A. It is described to an erasing method of the flash memory of the structure shown in FIG. 1A.

At first, the terminals S, W, DW are set to the ground potential GND so that the voltage potential at the portions X and Y are the ground potential GND. The voltages may be established by the circuits VSC1 and VSC2.

Figure 4A:
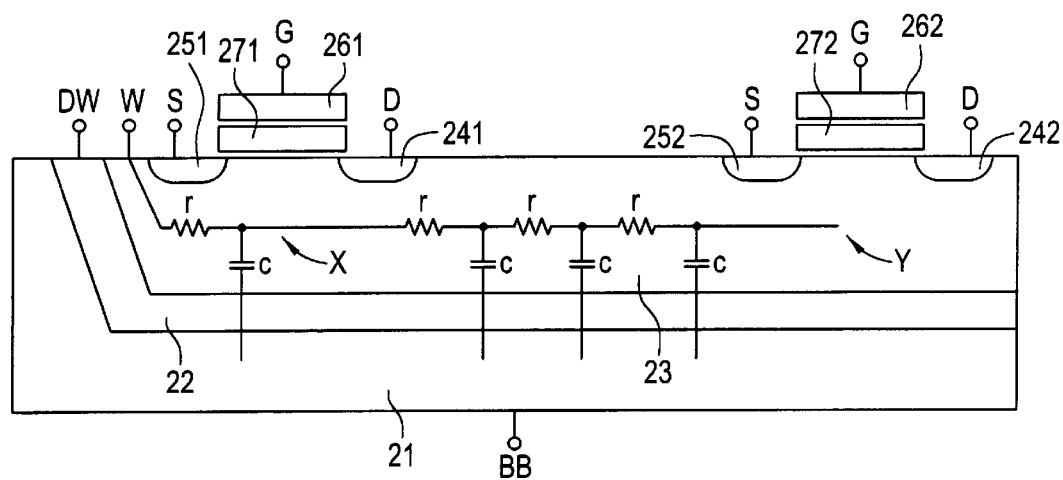
FIG. 4A is a cross sectional view of a flash memory cell of the related art and FIG. 4B show the respective voltages supplied at each of the portions of the flash memory shown in FIG. 4A.
Figure 4B:
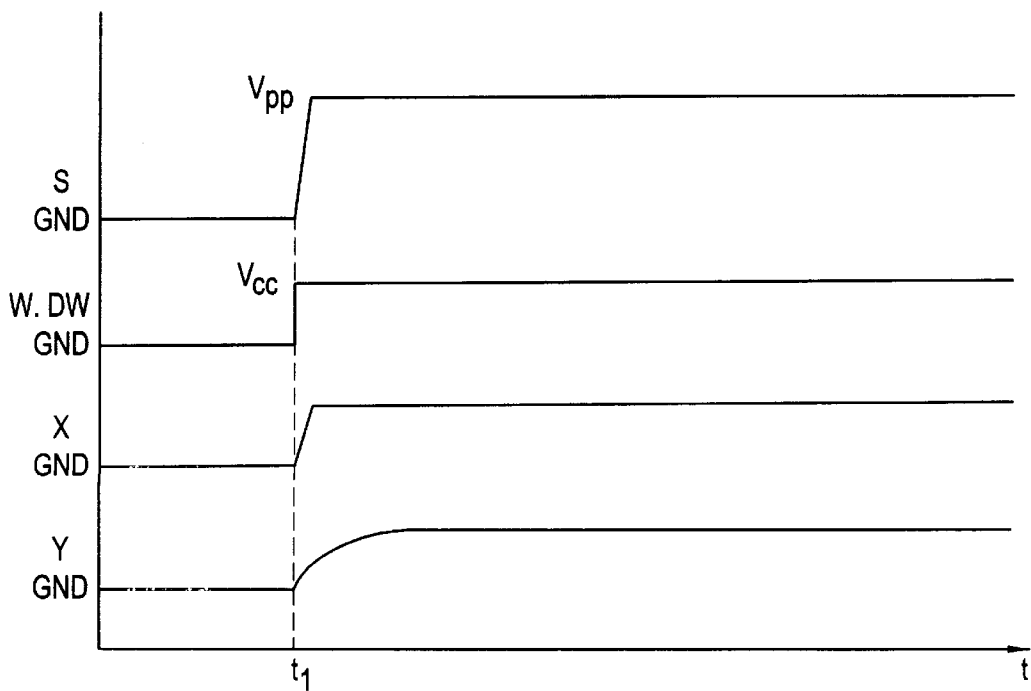

At time t1, $V_{CC}$ as the first erasing voltage, for example, 3.3V, is applied to the terminals W, DW by the circuit VSC1 for the wells 2, 3. Supplying the first erasing voltage the well 3 as well as the well 2 has the effect of preventing current from flowing from the well 3 of the P type into the well 2 of the N type. On the other hand, in the memory device shown in FIG. 4A, the well 23 is supplied with the voltage $V_{CC}$ but the well 22 is at an open state. It is problematic for the forward current to flow from the well 23 of the P type into the well 22. In FIG. 1A, the source terminals S are supplied with the voltage $V_{CC}$ such as 3.3V by the circuit VSC2. If the source terminals S are still supplied with the ground voltage GND when the terminal W is supplied with the voltage $V_{CC}$, the forward current flows from the well 3 to the source 51. The voltage supplied to the source terminals S is therefore changed from the ground voltage GND to the voltage $V_{CC}$ at time t1. The source 51 may be open so that the voltage of the source 51 rises almost to the voltage $V_{CC}$ due to the voltage supplied with the well 3 which connects forward with the source 51. The establishment may be set up by the circuit VSC2. The terminals G, BB are supplied with ground voltage GND and the drain terminal D is at an open state.

Then after a lapse of a predetermined period of time from the time t1, $V_{PP}$ as the second erasing voltage, for example, about 15V, is applied to the terminals S for the sources 51, 52 by the circuit VSC2 at time t2. The predetermined period of time is defined as greater than a time constant t for charging determined by a parasitic capacitance c relevant to the well 3 and a resistor r from the terminal W to the memory cell near the central portion of the memory cell array ($t=\Sigma(r \cdot c)$). Since this can eliminate scattering in the substrate potential present in the prior art and all the cells are eliminated under the identical conditions, scattering in the erasing function is decreased. The time constant t is calculated upon designing by dividing the load over the entire well into a distribution constant circuit and t1 and t2 are prepared by a delay circuit (not illustrated). Since the delay circuit is smaller in size compared with a circuit for generating the negative voltage $V_{ER}$ as explained for the prior art and a usual delay circuit can be used therefor, it is not necessary to consider a program of additionally providing a new circuit.

In this embodiment, since the memory cell is formed in the well disposed on every erasing unit, the parasitic capacitance c and the resistor r on every well are decreased and the time constant t for charging is reduced, the interval between t1 and t2 can be reduced and the erasing time is not greatly extended.

Further, in this embodiment, since the voltage $V_{CC}$ is applied previously to the wells 2, 3 (terminal W, DW) before the voltage $V_{PP}$ is supplied with the source 51, a source potential of the source 51 in a forward junction with the well 3 is also increased to almost $V_{CC}$ to provide the benefit of shortening the rising time of the voltage in a case of applying the erasing voltage $V_{PP}$ to the source 51 (terminal S). That is, the rising time is a period when voltage of the source 51 rises from the voltage $V_{CC}$ to the voltage $V_{PP}$ but from the ground voltage GND to the voltage $V_{PP}$.

As has been described above, according to the present invention, since a voltage is previously applied to the well terminal and, after the predetermined period of time, the erasing voltage $V_{PP}$ is applied to the source terminal. The erasing voltage $V_{PP}$ can therefore be applied after the substrate potential becomes equal for all the cells in the memory cell array on every erasing unit. Accordingly, the conditions upon erasing becomes uniform and scattering of threshold values after erasing caused, for example, by the occurrence of the inter-band tunnel can be reduced.

It is apparent from the specification that the present invention is not limited to the above-described embodiments but may be modified and changed without departing from the scope and spirit of the invention.

What is claimed is:

1. A semiconductor memory having a memory cell including a floating gate, the semiconductor memory comprising:
a semiconductor substrate of a first conductive type;
a first well of a second conductive type formed on said semiconductor substrate;
a second well of said first conductive type formed on said first well;
a source region of the memory cell formed on said second well;
a means for applying a first voltage to said source region after a second voltage lower than said first voltage is applied to said second well.

2. A semiconductor memory, comprising:
a semiconductor substrate of a first conductive type;
a first well of a second conductive type formed on said semiconductor substrate;
a second well of said first conductive type formed on said first well;
a first memory cell having a floating gate and a source region, said source region being of said second conductive type formed on said second well;
a first voltage applying circuit which applies a first voltage to said second well; and
a second voltage applying circuit which applies a second voltage higher than said first voltage to said source region;
wherein said second voltage is applied to said source region after said first voltage is applied to said second well.

3. The semiconductor memory as claimed in claim 2, wherein said source region is at open state when said first voltage is applied to said substrate.

4. The semiconductor memory as claimed in claim 2, wherein said source region is supplied with said first voltage from said second well when said first voltage is applied to said second well.

5. The memory as claimed in claim 4, wherein said first conductive type is a P type and said second conductive type is a N type.

6. The memory as claimed in claim 2, wherein said first conductive type is a P type and said second conductive type is a N type.

7. The memory as claimed in claim 5, wherein said first well is supplied with said second voltage when said second well is supplied with said second voltage.

8. The memory as claimed in claim 6, wherein said first well is supplied with said second voltage when said second well is supplied with said second voltage.

9. The memory as claimed in claim 7, wherein said first memory comprises a drain region and a control gate, said semiconductor substrate and said control gate are supplies with a ground voltage and said drain region is at open state when said first voltage is applied to said second well.

10. The memory as claimed in claim 8, wherein said first memory comprises a drain region and a control gate, said semiconductor substrate and said control gate are supplied with a ground voltage and said drain region is at open state when said first voltage is applied to said second well.

11. The memory as claimed in claim 9, wherein said first and second voltages are first and second erasing voltage, respectively.

12. A semiconductor memory, comprising:
a P type semiconductor substrate;
a N type deep well formed in said P type semiconductor substrate;
a P type shallow well formed in said N type deep well;
a first memory cell having a first control gate, a first floating gate, a first source region formed on said P type shallow well, and a first drain region formed on said P type shallow well;

a second memory cell having a second control gate, a second floating gate, a second source region formed on said P type shallow well, and a second drain region formed on said P type shallow well;

said second memory cell arranged farther from an end of said second well adjacently to a surface of said first well compared with said first memory cell;

a terminal located on said end of said second well;

a first erasing voltage supply circuit which applies a first erasing voltage to said first well and said terminal;

a second erasing voltage supply circuit which applies a second erasing voltage higher than said first erasing voltage to said first and second source regions by a predetermined period after said first erasing voltage supply circuit applies said first erasing voltage to said first well and said terminal.

* * * * *